United States Patent [19]
Russell

[11] Patent Number: 5,828,118
[45] Date of Patent: Oct. 27, 1998

[54] SYSTEM WHICH USES POROUS SILICON FOR DOWN CONVERTING ELECTROMAGNETIC ENERGY TO AN ENERGY LEVEL WITHIN THE BANDPASS OF AN ELECTROMAGNETIC ENERGY DETECTOR

[75] Inventor: Stephen D. Russell, San Diego, Calif.

[73] Assignee: The United States of America as represented by the Secretary of the Navy, Washington, D.C.

[21] Appl. No.: 812,680

[22] Filed: Mar. 6, 1997

Related U.S. Application Data

[63] Continuation-in-part of Ser. No. 118,900, Sep. 9, 1993, abandoned.

[51] Int. Cl.[6] .............................. H01L 31/00; H01L 29/06
[52] U.S. Cl. ........................ 257/466; 257/214; 257/225; 257/290; 257/369; 257/458; 257/462; 257/618
[58] Field of Search ................................ 257/225, 214, 257/290, 369, 458, 462, 466, 618

[56] References Cited

U.S. PATENT DOCUMENTS 5,569,932 10/1996 Shor et al. .................................. 257/3
5,696,629 12/1997 Berger et al. ........................... 359/582

*Primary Examiner*—Ngân V. Ngô
*Attorney, Agent, or Firm*—Harvey Fendelman; Peter A. Lipovsky; Michael A. Kagan

[57] ABSTRACT

An electromagnetic energy detector system down converts electromagnetic energy from a relatively high energy beyond the detectable range of an electromagnetic energy detector to a lower energy level within the detectable range of the electromagnetic energy detector. The detector includes a transparent substrate, a porous silicon structure formed on the substrate for down converting electromagnetic energy characterized by a first wavelength W1 to electromagnetic energy characterized by a second wavelength W2, where W2>W1; and an electromagnetic energy detector for detecting the down converted electromagnetic energy. The detector is useful in applications where the electromagnetic energy detector would ordinarily be incapable of detecting the higher level electromagnetic energy directly without going through the down conversion process effectuated by the porous silicon structure.

17 Claims, 5 Drawing Sheets

SYSTEM WHICH USES POROUS SILICON FOR DOWN CONVERTING ELECTROMAGNETIC ENERGY TO AN ENERGY LEVEL WITHIN THE BANDPASS OF AN ELECTROMAGNETIC ENERGY DETECTOR

CROSS REFERENCE TO RELATED APPLICATION

This is a continuation-in-part of application Ser. No. 08/118,900 filed 9 Sep. 1993, now abandoned.

BACKGROUND OF THE INVENTION

The present invention generally relates to the field of electromagnetic energy detectors, and more particularly, to an energy detector which uses porous silicon for down converting electromagnetic energy from a relatively high energy beyond the detectable range of an electromagnetic energy detector to a lower energy level within the detectable range of the electromagnetic energy detector.

There are a variety of applications in which it is advantageous to convert light from one wavelength (or energy) to another. One well-known application involves converting invisible infrared light having a relatively long wavelength to visible light having a longer wavelength, and hence, higher energy, using night vision goggles. Converting electromagnetic energy from a lower wavelength to a higher wavelength is known as "up conversion." A complimentary concept is the down conversion (in energy) of high energy invisible electromagnetic energy such as ultraviolet (UV) light to optical energy in the visible range or even to infrared energy. Development of a low cost system for down converting electromagnetic energy could expand the viewing range of many types of instruments. Such technology could find tremendous applications in military systems, medical diagnostic equipment, and consumer electronics, including virtual reality systems.

Another potential application for electromagnetic down converting systems may be in the high performance optical detector industry. A number of image-gathering detectors use backside-illuminated charge coupled devices (CCDs) which are solid state electronic imaging devices which read out image charges from wells in an array of pixels. CCDs rely on the physics of photo-excited carriers in a semiconductor substrate whose image charges are collected by an array of pixels. When the silicon substrate upon which the array resides is made thin enough to permit short-wavelength light (blue and ultraviolet) to penetrate into the active regions of the device, it is possible to obtain CCDs with improved spectral response. However, for a backside-illuminated CCD, the electrical characteristics in a shallow region near the back surface dominate the CCD response to short wavelength photons. Silicon develops a thin native oxide (<30 Å thick) that can contain enough trapped positive charge to deplete a region several thousand Angstroms deep into the CCD. The absorption depth for high energy (blue or UV) photons in silicon is very short (about 30 Å for 250 nm light). Photo generated electrons created in this region can drift toward the $Si/SiO_2$ interface and become trapped or recombine thereby drastically reducing the quantum efficiency in the UV and blue.

A need therefore exists for a system which can efficiently and economically convert electromagnetic energy having a relatively high energy level (i.e, short wavelength) to electromagnetic energy having a relatively lower energy (i.e., longer wavelength).

SUMMARY OF THE INVENTION

The present invention provides an electromagnetic energy detector for down converting electromagnetic energy from a relatively high energy beyond the detectable range of an electromagnetic energy detector to a lower energy level within the detectable range of the electromagnetic energy detector. The detector includes a transparent substrate, a porous silicon layer formed on the substrate to create a porous silicon structure for down converting electromagnetic energy characterized by a first wavelength WI to electromagnetic energy characterized by a second wavelength W2, where W2>W1; and an electromagnetic energy detector mounted to the transparent substrate for detecting the down converted electromagnetic energy.

Another embodiment of the invention employs a stack of multiple porous silicon structures concatenated in a linear fashion to provide multiple down-conversions of energy. In yet another embodiment, the electromagnetic energy detector is mounted a fixed distance from the electromagnetic energy detector. In a fourth embodiment of the invention, an optical directing element, such as a fiber optic bundle, prism, optical fiber, or mirror, may be used to direct down converted electromagnetic energy from the porous silicon structure to the electromagnetic energy detector.

The detector is useful in applications where an electromagnetic energy detector would ordinarily be incapable of detecting the higher level electromagnetic energy directly without going through the down conversion process effectuated by the porous silicon structure or in applications in which it is desirable to improve detection efficiency. This and other advantages of the present invention will become more apparent upon review of the accompanying specification, including the claims, and the appended drawings.

BRIEF DESCRIPTION OF THE DRAWINGS

Throughout the several views, like elements are referenced using like designations

DESCRIPTION OF PREFERRED EMBODIMENTS

The present invention provides an electromagnetic energy detector for down converting electromagnetic energy from a relatively high energy beyond the detectable range of an electromagnetic energy detector to a lower energy level within the detectable range of the electromagnetic energy detector. All of the embodiments of the invention described herein may be fabricated in accordance with techniques well known in the art of microelectronic device fabrication.

Figure 1:
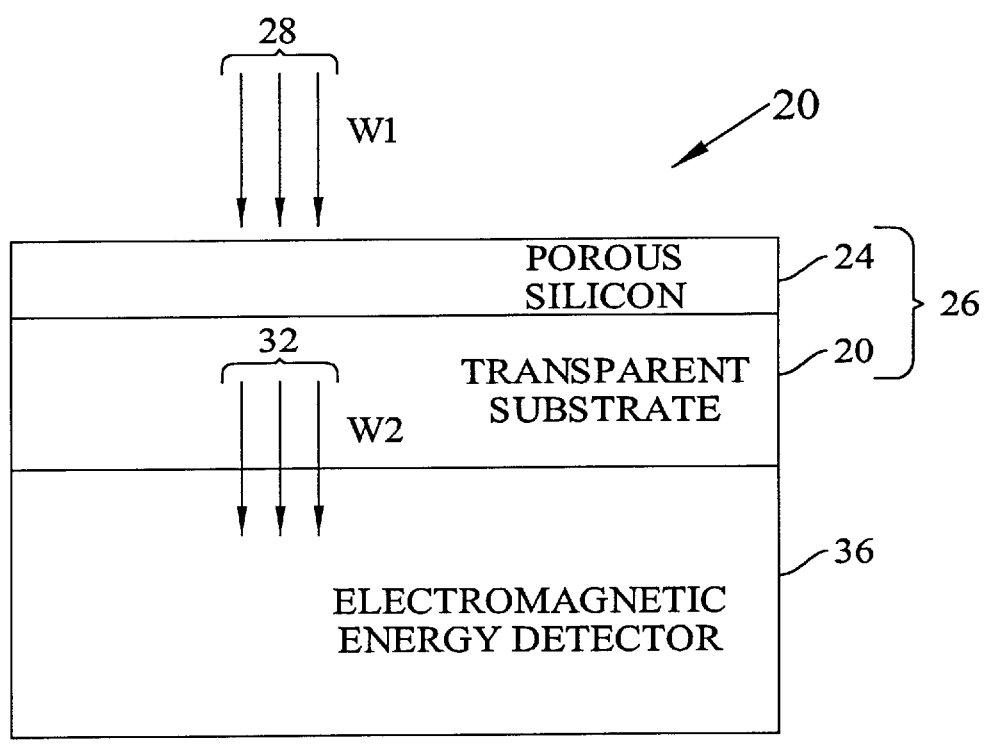
FIG. 1 is cross-sectional view of an electromagnetic energy detector system which uses a porous silicon structure mounted to an electromagnetic energy detector and which embodies various features of the present invention.

Referring to FIG. 1, detector 20 includes a transparent substrate 20, a porous silicon layer 24 formed on substrate 20 for down converting electromagnetic energy 28 characterized by a first wavelength W1 to electromagnetic energy 32 characterized by a second wavelength W2, where W2>W1; and an electromagnetic energy detector 36 mounted to the transparent substrate 20 for detecting electromagnetic energy 32. The transparent substrate 20 provides structural support for the porous silicon layer 24 and may be formed from materials such as sapphire, glass, quartz, fused silica, magnesium oxide, magnesium fluoride, diamond, yttria stabilized zirconium (YSZ), ruby (Cr:Al$_2$O$_3$), yttria alumina garnet (YAG). Sapphire provides excellent dielectric isolation, thermal conductivity, transparency, rigidity, flatness, hardness, and resistance to chemicals. The transparent substrate 20 and porous silicon layer 24 may collectively be referenced as a porous silicon structure 26. However, it is to be understood that the scope of the invention includes transposing porous silicon layer 24 with transparent substrate 20 so that incident electromagnetic energy 28 is transmitted through substrate 20 prior to being down converted in porous silicon layer 24. The invention is useful in applications where the electromagnetic energy detector 36 would ordinarily be incapable of detecting electromagnetic energy 28 directly without going through the down conversion process effectuated by porous silicon layer 24.

The porous silicon layer 24 may constructed in accordance with co-pending and commonly assigned application Ser. No. 08/118,900, filed 9 Sep. 1993. The electromagnetic energy detector 36 may be implemented by devices that include, without limitation, a CCD device such as described in commonly assigned co-pending application Ser. No. 08/273,445, filed 5 Jul. 1994, a photo multiplier tube of the type described in commonly assigned U.S. Pat. No. 5,329,110, photo diodes, CMOS optical detector, charge injection devices (CIDs), solar cells, photo transistors, and a P-I-N (p-type layer+insulating layer+n-type layer) diode detector. Application Ser. No. 08/273,445 and U.S. Pat. No. 5,329,110 are incorporated herein by reference.

Figure 2:
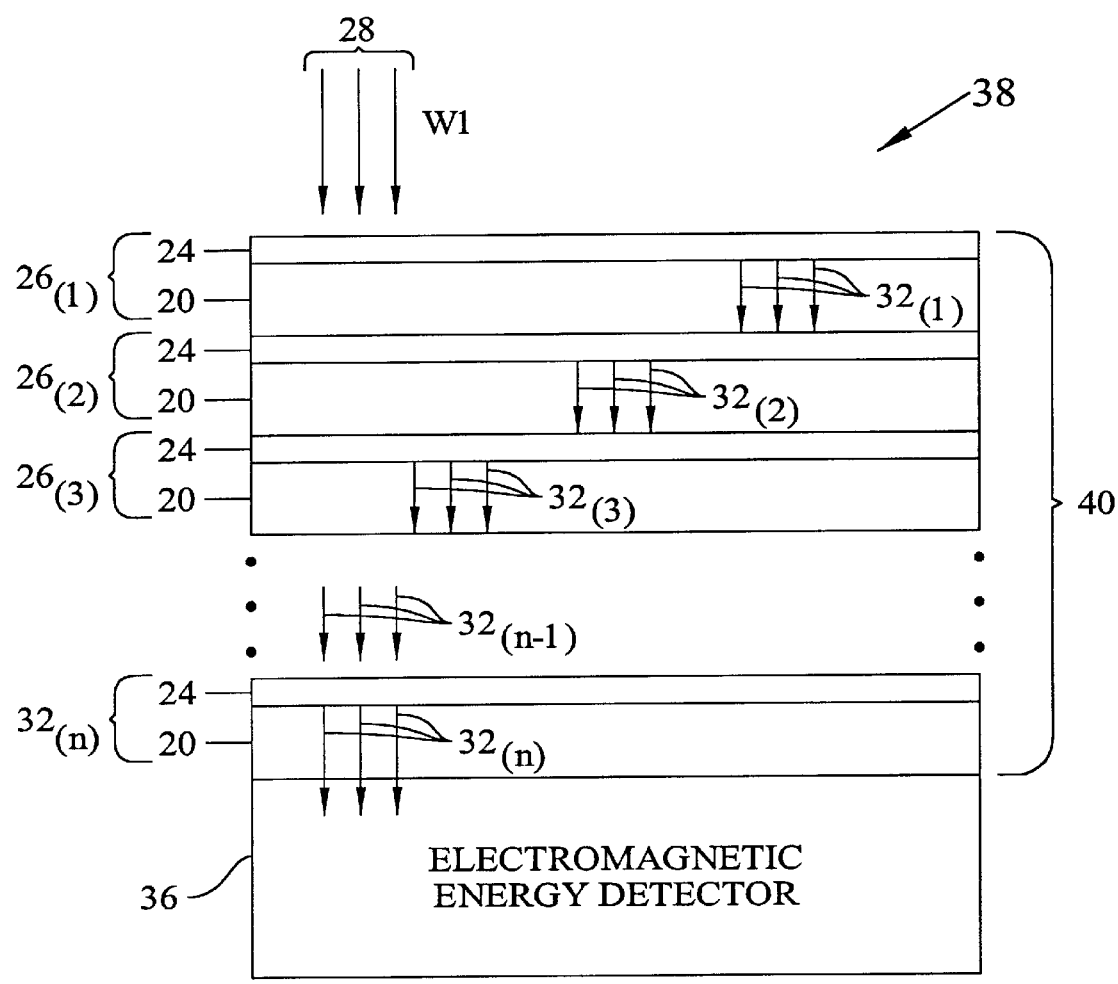
FIG. 2 is a cross-sectional view of an electromagnetic energy detector system which uses a stack of porous silicon structures to provide multiple down converting stages.

In FIG. 2 there is shown an electromagnetic energy detector system 38 embodying various features of the present invention comprised of a stack 40 of an n number of porous silicon structures 26$_{(I)}$ mounted on top of electromagnetic energy detector 36, where n and I are positive integers and I ≦ n. The number of porous silicon structures 26 employed in system may be selected to suit the requirements of a particular application. The porous silicon structures 26 are concatenated in a linear fashion to provide multiple down-conversions of energy. For example, porous silicon structure 26$_{(1)}$ down converts energy 28 into energy 32$_{(1)}$, porous silicon structure 26$_{(2)}$ down converts energy 32$_{(1)}$ into energy 32$_{(2)}$, porous silicon structure 26$_{(3)}$ down converts energy 32$_{(2)}$ into energy 32$_{(3)}$, and so forth.

Figure 3:
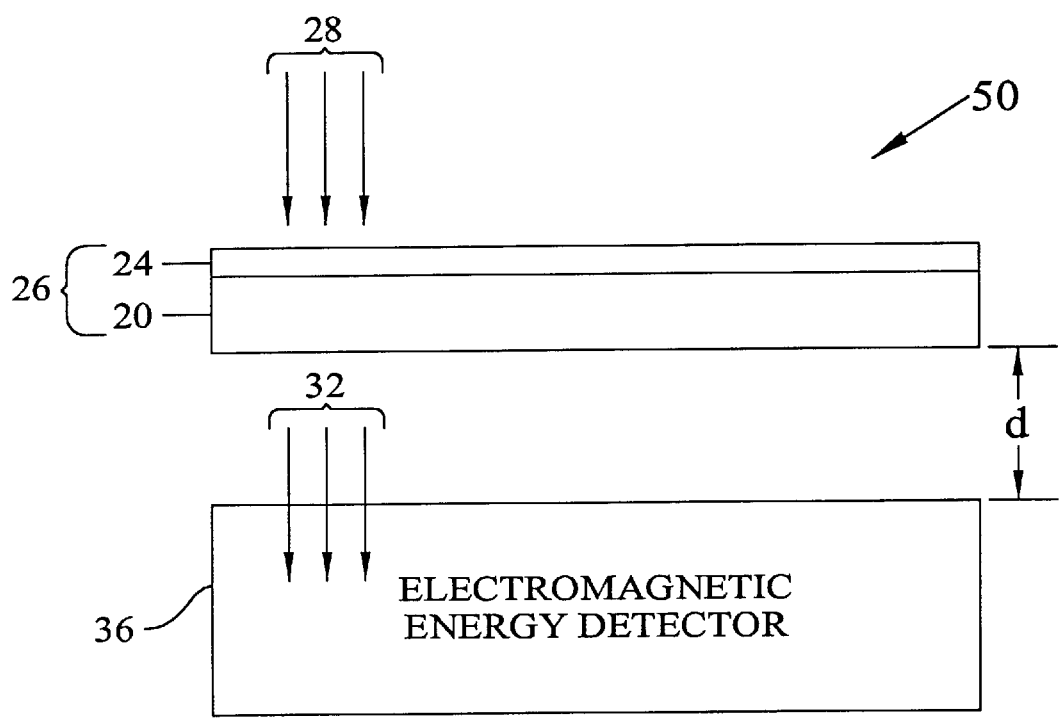
FIG. 3 a cross-sectional view of an electromagnetic energy detector system which uses a porous silicon structure mounted in a spaced relation with respect to an electromagnetic energy detector.

FIG. 3 shows another embodiment of an electromagnetic energy detector system 50 of the present invention which includes a porous silicon structure 26 mounted a fixed distance, d, above electromagnetic energy detector 36. Although system 50 shows only one porous silicon structure 26, it is to be understood that system 50 may include a stack 40 comprised of any suitable number of porous silicon structures 26.

Figure 4:
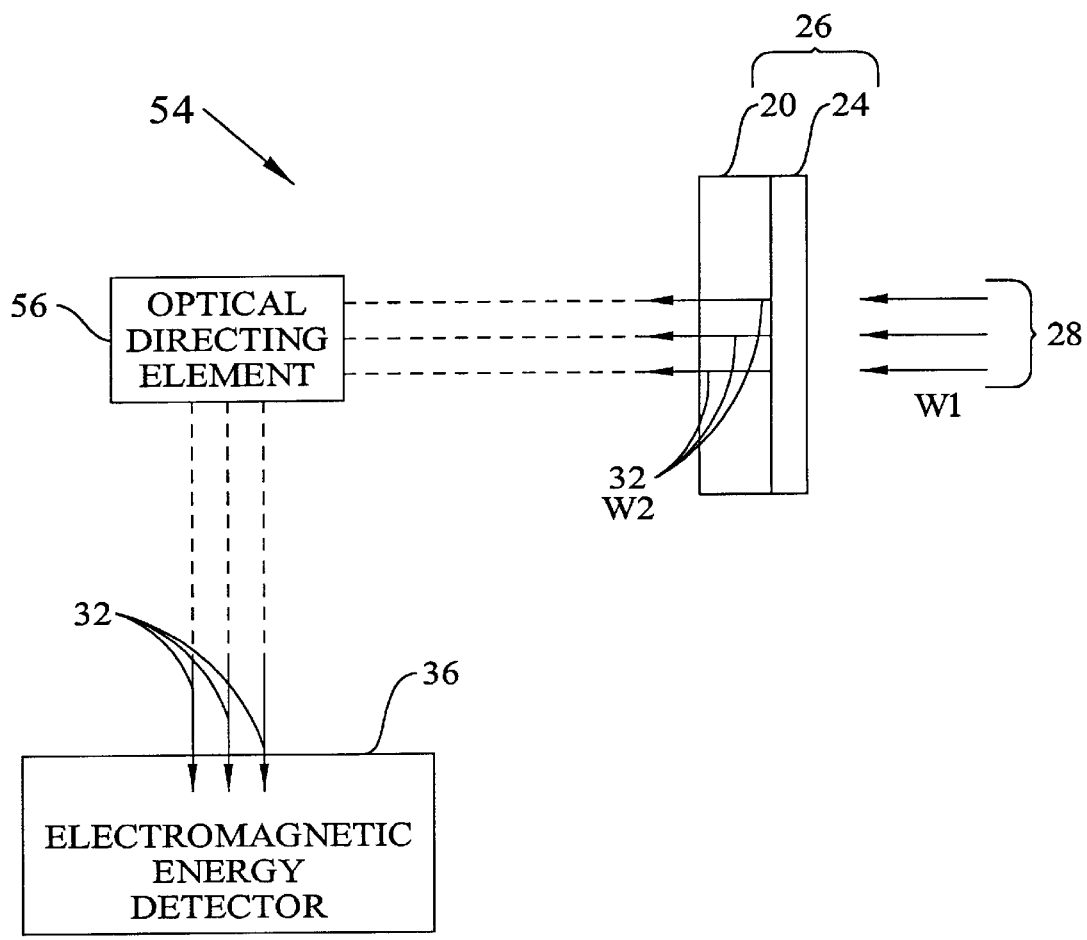
FIG. 4 is a cross-sectional view of another embodiment of an optical energy detector system in which do converted electromagnetic energy is directed from the porous silicon structure to the electromagnetic energy detector via an optical directing element.

In FIG. 4 there is shown an electromagnetic energy detector system 54 embodying various features of the present invention comprised of a porous silicon structure 26, an optical directing element 56, and an electromagnetic energy detector 36. The optical directing element 56 may be implemented, for example, as a prism, mirror, lens, optical fiber, or fiber optic bundle. The porous silicon structure 24 down converts electromagnetic energy 28 having a relatively high energy level characterized by a wavelength W1 to electromagnetic energy 32 having a relatively low energy level characterized by a wavelength W2, where W2>W1. Electromagnetic energy 32 is directed via optical directing element 56 to electromagnetic energy detector 36. The electromagnetic energy detector 36 has a bandpass capable of efficiently detecting electromagnetic energy 32, but which generally is not capable of detecting electromagnetic energy 28. In other words, energy 28 generally falls outside the bandpass of the detector 36.

Figure 5:
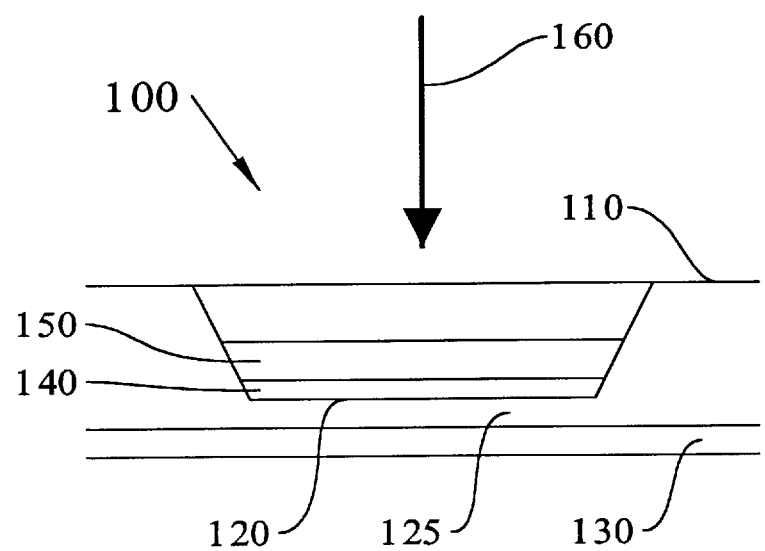
FIG. 5 is a cross-sectional view of another embodiment of an optical energy detector system embodying various features of the present invention.

Referring to FIG. 5, there is shown an optical detector system 100 comprising a porous silicon structure comprised of a porous silicon layer 150 formed on a transparent layer 140, all of which are integrated into a backside illuminated charge coupled device (CCD) 110. CCD 110 includes an optically active back surface 120, frontside circuitry 130, and a region 125 in which electrical charge carriers are optically generated, i.e., where optical to electrical conversion takes place in CCD 110. Transparent layer 140 is formed on back surface 120 and may be formed, for example, as a native silicon oxide or as a deposited or grown transparent layer. Porous silicon layer 150 is formed on top of the transparent layer 140 to effect the energy conversion of incident light 160 to light (not shown) having a lower energy level (longer wavelength) which is transmitted through transparent layer 140 to back surface 120 and detected by region 125. Additional transparent layers may be formed over porous silicon layer 150 or interposed between porous silicon layer 150 and back surface 120 without effecting the essential functioning of optical detector system 100.

Obviously, many modifications and variations of the present invention are possible in light of the above teachings. Therefore, it is to be understood that within the scope of the appended claims, the invention may be practiced otherwise than as specifically described.

I claim:

1. An electromagnetic energy detector system using porous silicon for down converting electromagnetic energy, comprising:

a transparent substrate:

a porous silicon layer formed on said substrate for down converting electromagnetic energy characterized by a first wavelength W1 to electromagnetic energy characterized by a second wavelength W2, where W2>W1; and an electromagnetic detector for detecting said electromagnetic energy characterized by said second wavelength.

2. The detector system of claim 1 wherein said electromagnetic detector is an optical detector.

3. The detector system of claim 2 wherein said optical detector is selected from the group which includes a charge coupled device, a photo multiplier tube, a CMOS optical detector, a charge injection device, a solar cell, a photo transistor, and a P-I-N diode detector.

4. The detector system of claim 1 wherein said electromagnetic detector is an infrared detector.

5. An electromagnetic energy detector system using porous silicon for down converting electromagnetic energy, comprising:

a stack of porous silicon structures for down converting electromagnetic energy characterized by a first wavelength W1 to electromagnetic energy characterized by a second wavelength W2, where W2>W1, each porous silicon structure comprising a transparent substrate and a porous silicon layer formed on said substrate; and an electromagnetic detector for detecting said electromagnetic energy characterized by said second wavelength.

6. The detector system of claim 5 wherein said electromagnetic detector is an optical detector.

7. The detector system of claim 6 wherein said optical detector is selected from the group which includes a charge coupled device, a photo multiplier tube, a CMOS optical detector, a charge injection device, a solar cell, a photo transistor, and a P-I-N diode detector.

8. The detector system of claim 5 wherein said electromagnetic detector is an infrared detector.

9. An electromagnetic energy detector system using porous silicon for down converting electromagnetic energy, comprising:

a transparent substrate:

a porous silicon layer formed on said substrate for down converting electromagnetic energy characterized by a first wavelength W1 to electromagnetic energy characterized by a second wavelength W2, where W2>W1; and an electromagnetic detector mounted a fixed distance from said transparent substrate for detecting said electromagnetic energy characterized by said second wavelength.

10. The detector system of claim 9 wherein said electromagnetic detector is an optical detector.

11. The detector system of claim 10 wherein said optical detector is selected from the group which includes a charge coupled device, a photo multiplier tube, a CMOS optical detector, a charge injection device, a solar cell, a photo transistor, and a P-I-N diode detector.

12. The detector system of claim 9 wherein said electromagnetic detector is an infrared detector.

13. An electromagnetic energy detector system using porous silicon for down converting electromagnetic energy, comprising:

a transparent substrate:

a porous silicon layer formed on said substrate for down converting electromagnetic energy characterized by a first wavelength W1 to electromagnetic energy characterized by a second wavelength W2, where W2>W1;

an electromagnetic detector for detecting said electromagnetic energy characterized by said second wavelength; and an optical directing element for directing said electromagnetic energy characterized by said second wavelength from said transparent substrate to said electromagnetic detector.

14. The detector system of claim 13 wherein said electromagnetic detector is an optical detector.

15. The detector system of claim 14 wherein said optical detector is selected from the group which includes a charge coupled device, a photo multiplier tube, a CMOS optical detector, a charge injection device, a solar cell, a photo transistor, and a P-I-N diode detector.

16. The detector system of claim 13 wherein said electromagnetic detector is an infrared detector.

17. The detector system of claim 13 wherein said optical directing element is selected from the group which includes an optical fiber bundle, an optical fiber, a lens, a mirror, and a prism.

* * * * *